United States Patent
Arce Vivas et al.

(10) Patent No.: US 11,953,551 B2
(45) Date of Patent: Apr. 9, 2024

(54) MODULE AND METHOD FOR INITIALIZING AND CALIBRATING A PRODUCT DURING THE MANUFACTURE THEREOF

(71) Applicant: Continental Teves AG & Co. OHG, Frankfurt am Main (DE)

(72) Inventors: Eduardo Lopez Arce Vivas, Frankfurt am Main (DE); Manuel Deppner, Florstadt (DE); Matthew Leo Grilliot, Humble, TX (US)

(73) Assignee: Continental Automotive Technologies GmbH, Hannover (DE)

( * ) Notice: Subject to any disclaimer, the term of this patent is extended or adjusted under 35 U.S.C. 154(b) by 316 days.

(21) Appl. No.: 17/595,913

(22) PCT Filed: May 26, 2020

(86) PCT No.: PCT/EP2020/064515
§ 371 (c)(1),
(2) Date: Nov. 29, 2021

(87) PCT Pub. No.: WO2020/239731
PCT Pub. Date: Dec. 3, 2020

(65) Prior Publication Data
US 2022/0317183 A1    Oct. 6, 2022

(30) Foreign Application Priority Data
May 29, 2019   (DE) ..................... 10 2019 207 868.0

(51) Int. Cl.
*G01R 31/319*   (2006.01)
*G01R 31/28*   (2006.01)
(Continued)

(52) U.S. Cl.
CPC ..... *G01R 31/3191* (2013.01); *G01R 31/2844* (2013.01); *G01R 31/3025* (2013.01);
(Continued)

(58) Field of Classification Search
None
See application file for complete search history.

(56) References Cited

U.S. PATENT DOCUMENTS 4,819,195 A    4/1989   Bell
9,989,593 B2*  6/2018   Wager ............... G01R 31/2834
(Continued)

FOREIGN PATENT DOCUMENTS

DE    3784047 T2    8/1996
DE    60104854 T2   9/2005
(Continued)

OTHER PUBLICATIONS

European Examination Report dated Nov. 3, 2023 for the counterpart European Patent Application No. 20 728 476.1 and translation of same.
(Continued)

*Primary Examiner* — K. Wong

(57) ABSTRACT

A module for initializing and calibrating a product during the manufacture of the product in a manufacturing environment, wherein the module is able to be arranged on the product and wherein the module has a first interface for wireless data transmission between the module and the manufacturing environment, a second interface for establishing a data connection between the module and the product, an electrical energy source and a data processing unit. The module is designed to supply the product at least temporarily with energy by way of the energy source, to establish a data connection with the product via the second interface, to perform test and/or calibration routines on the
(Continued)

product via the second interface, wherein the data processing unit generates test and/or calibration data during the performance of the test and/or calibration routines, and to transmit the test and/or calibration data to the manufacturing environment via the first interface.

11 Claims, 3 Drawing Sheets

(51) Int. Cl.
G01R 31/302 (2006.01)
G01R 31/317 (2006.01)
G06Q 10/0639 (2023.01)
G06Q 50/04 (2012.01)

(52) U.S. Cl.
CPC . *G01R 31/31721* (2013.01); *G06Q 10/06395* (2013.01); *G06Q 50/04* (2013.01)

(56) References Cited

U.S. PATENT DOCUMENTS

| 2002/0091979 A1 | 7/2002 | Cooke |
| 2004/0177238 A1 | 9/2004 | Tagawa |

FOREIGN PATENT DOCUMENTS

| DE | 602006000424 T2 | 1/2009 |
| EP | 1273923 A1 | 1/2003 |
| EP | 1282041 A2 | 2/2003 |
| WO | 2006029612 A1 | 3/2006 |

OTHER PUBLICATIONS

German Search Report dated Jan. 31, 2020 for the counterpart German Patent Application No. 10 2019 207 868.0.
International Search Report and the Written Opinion of the International Searching Authority mailed on Jun. 22, 2020 for the counterpart PCT Application No. PCT/EP2020/064515.

* cited by examiner

MODULE AND METHOD FOR INITIALIZING AND CALIBRATING A PRODUCT DURING THE MANUFACTURE THEREOF

CROSS-REFERENCE TO RELATED APPLICATIONS

The present application is a National Stage Application under 35 U.S.C. 371 of International Application No. PCT/EP2020/064515 filed on May 26, 2020, which claims priority from German Patent Application No. 10 2019 207 868.0 filed on May 29, 2019, in the German Patent and Trade Mark Office, the disclosures of which are herein incorporated by reference in their entireties.

BACKGROUND

1. Field

Embodiments of the present application relate to a module for initializing and calibrating a product during the manufacture of the product as claimed in claim 1, to a method for initializing a product during the manufacture of the product as claimed in claim 7, and to the use of a module for initializing a braking module during the manufacture of the braking module as claimed in claim 12.

2. Description of Related Art

In known manufacturing environments, for example a production line for braking modules or the like, products that have not yet been completed are usually conveyed from one manufacturing station to the next manufacturing station. Each of these manufacturing stations in this case generally performs one of the following processes:
  it adds components or functions to the product (for example using mechanical processes, calibration routines, etc.)
  it tests the product as to whether the previously added components and/or functions have been added successfully and are working correctly.

During the final assembly of mechatronic systems, such as for example braking modules, manufacturing stations used at the end of the manufacturing process (EOL, End-Of-Line) are used as an energy source for the product and communicate with the product. The purpose of these stations is to trigger functions of the product and to check whether the product is working as intended, or to calibrate the product and its functions.

Conveying and transferring the product from one manufacturing station to the next manufacturing station is complex and time-consuming in this case.

SUMMARY

An object of the present application relates to specifying a possibility for being able to improve the efficiency of the manufacturing process.

This object is achieved by way of the module for initializing a product as claimed in claim 1 and by way of the method for initializing a product as claimed in claim 7. Preferred embodiments of the module are specified in claims 2 to 6, while preferred embodiments of the method are specified in claims 8 to 11.

In a first aspect, an object of an embodiment relates to a module for initializing a product during the manufacture of the product in a manufacturing environment, wherein the module is able to be arranged on the product. The module in this case has a first interface for wireless data transmission between the module and the manufacturing environment, a second interface for establishing a data connection between the module and the product, an electrical energy source and a data processing unit. The module is in this case designed to supply the product at least temporarily with energy by way of the energy source, to establish a data connection with the product via the second interface, to perform test and/or calibration routines on the product via the second interface, wherein the data processing unit generates test and/or calibration data during the performance of the test and/or calibration routines, and to transmit the test and/or calibration data to the manufacturing environment via the first interface.

According to objects of embodiments of the present application, providing a module that is already able to be arranged on a product during the manufacture of the product and that, due to its design, is suitable for performing particular functions, which are usually only able to be performed at manufacturing or testing stations, already while the product is being transported from one station to the next station. The transport time between the stations is thus already effectively used for particular tasks that then no longer have to be performed at the stations, such that downtimes at the stations are able to be reduced. Overall, this increases the efficiency of a manufacturing process for a product.

The fact that the module is able to be arranged on the product means in this case that the module is a separate element that is able to be attached to the product such that it accompanies the product on its way through a manufacturing environment. Likewise, the module may also be removed from the product again after the manufacturing process is complete, ideally without leaving any residue.

The first interface of the module may be for example a WLAN interface via which the module is able to communicate with the manufacturing environment. The communication preferably takes place between the module and a central control unit that controls the manufacturing environment. The central control unit does not necessarily have to be a stationary computer or server within the manufacturing environment in this case. On the contrary, provision may also be made for the module to communicate via a network with a delocalized control unit, in particular with control logic that is implemented in the cloud. This makes it possible to track the path and the state or status of a product within the manufacturing environment from anywhere at any time, and at the same time to influence the further manufacturing process.

Provision may furthermore also be made for the module to communicate directly with the individual manufacturing stations within the manufacturing environment. In addition to a WLAN connection between the module and the manufacturing environment, any other wireless data transmission method is however also conceivable, for example Bluetooth. Provision may furthermore also be made for wired communication between the module and the manufacturing environment, as will be explained in more detail below.

In the communication between the module and the manufacturing environment, the module is preferably able to be identified uniquely at any time by the manufacturing environment. For this purpose, provision may be made for example for the module to be assigned a Globally Unique Identifier (GUID), which the module likewise transmits during wireless communication with the manufacturing environment. Owing to the fixed assignment of a module to a product, each product is in this case able to be identified uniquely at any time in the manufacturing process.

The electrical energy source of the module is preferably a battery, the capacity of which is sufficient to perform simple functions of the product that are necessary for performing test and/or calibration routines of the product.

According to one preferred embodiment, the module is in this case designed to configure a software function of the product after the data connection has been established. A software function of the product may for example be a function whose effect is defined by specifying particular operating parameters and boundary conditions.

By way of example, software functions of a product may in this case differ for different series of the product. The software functions of the product may in particular be tailored to the requirements of a respective end customer. Using the module in this case makes it possible to initialize each of the individual products individually with an unchanged manufacturing environment, such that they are tailored to the requirements of the respective end customer.

The product is preferably a braking module, in particular an electrohydraulic control and regulation unit for a braking system. A software function for this braking module could in this case be an anti-lock braking control function that is able to be tailored to the requirements of a customer by specifying specific control parameters. Configuring such a software function would then comprise for example defining the respective control parameters.

According to one preferred embodiment, provision is furthermore made for the product to be supplied with energy by way of the second interface. The second interface in this case is therefore used both to establish a data connection with the product and to transmit electrical energy. The second interface accordingly has a dual function here, enabling a more compact design of the overall interface between the product and the module.

According to a further embodiment, secure and easily manageable attachment of the module to the product is achieved by virtue of the module having a holder, wherein the module is able to be attached to the product by way of the holder. The holder may be for example an interface in which the module is held by a form-fitting connection or a frictional connection. The holder may be designed for example in the form of a bayonet connection, a clip connection or holding rails. The holder is in this case preferably designed such that no elements individually customized to the holder have to be provided separately on the product. On the contrary, the aim is for the holder to interact in the desired manner with the geometry of the product that is already present on the product.

According to one preferred embodiment, provision is made in this case for the holder to be part of the second interface. In this case, an arrangement of the module on the product by way of the holder would also automatically connect the second interface to the product. This simplifies the process of connecting the module to the product.

A further preferred embodiment of the module consists in the module having a third interface for establishing a wired connection between the module and the manufacturing environment, wherein the third interface is designed to transmit electrical energy between the manufacturing environment and the module. A "wired connection" is in this case understood to mean any type of material connection in which the module and the manufacturing environment, or part of the manufacturing environment, are physically in contact via the connection. In this case, it is not absolutely necessary to provide cables in the actual sense between the module and the manufacturing environment. On the contrary, the "wired connection" may also be a connection in which the connection is already established when a first contact surface of the module comes into contact with a second contact surface of the manufacturing environment.

The third interface may in this case be adapted to a connector type or standard that is predefined by the manufacturing environment. This means that the module acts as an adapter between the product and the manufacturing environment, such that the connections on the product do not have to be adapted to the manufacturing environment. On the contrary, it is sufficient if the connections present on the module with the third interface are matched to the manufacturing environment. By virtue of the third interface, energy is in this case transmitted by the manufacturing environment, in particular a manufacturing station, via the module to the product, such that calibration and testing routines of the product that exhibit high energy consumption are able to be performed following connection to the manufacturing environment.

In addition to the transmission of electrical energy via the third interface, according to a further embodiment, provision is made for data to be transmitted between the module and the manufacturing environment, preferably in real time, via the third interface. In this case, when the connection is established via the third interface, data transmission via the second interface may either be dispensed with or be continued in parallel.

In a further aspect, embodiments of the application relate to a method for initializing a product during the manufacture of the product in a manufacturing environment by way of a module as has been described above. The method in this case has the following steps:

arranging the module on the product during manufacture thereof, the manufacturing environment activating the module, establishing a data connection between the module and the product via the second interface of the module, performing test and/or calibration routines on the product via the second interface of the module, wherein the data processing unit generates test and/or calibration data during the performance of the test and/or calibration routines, and transmitting the test and/or calibration data to the manufacturing environment via the first interface.

To activate the module, an appropriate activation command may for example be transmitted from the manufacturing environment to the module via the first interface of the module.

According to one preferred embodiment, provision is made in this case for the manufacturing environment to arrange the module on the product in the course of a manufacturing step of the product. By way of example, provision may be made in this case for the module, in the course of installing a particular component of the product, to be arranged on the product together with the component. There is therefore no need for any separate production step in order to arrange the module on the product.

According to a further embodiment, great flexibility of the method is in this case achieved by virtue of the test and/or calibration routines to be performed being transmitted to the module by the manufacturing environment.

As already described above, it is thus possible to tailor the configuration and the testing of the product during manufacture thereof to specific customer requirements without the need to adapt the product itself. It is thereby also possible to dynamically adapt the test routines or calibration routines that are applied during the manufacturing process, should this become necessary.

According to a further embodiment, provision is made in this case for the transmitted test and/or calibration routines to depend on previously transmitted test and/or calibration data. It is thereby possible to respond flexibly to which results have been achieved in previous tests and calibration of the product.

According to a further embodiment, provision is furthermore made for the manufacturing environment to have at least one test station, wherein the method furthermore comprises establishing a wired connection between the test station and the module via the third interface of the module, wherein the product is supplied with electrical energy by the test station after the wired connection has been established. Provision may also be made in this case, as an alternative or in addition to the supply of electrical energy by the test station, for data also to be transmitted, preferably in real time, via the third interface of the module as soon as a corresponding connection to the manufacturing station has been established.

In a further aspect, an object of an embodiment relates to the use of a module, as described above, for initializing a braking module, in particular an electrohydraulic control and regulation unit for a braking system, during the manufacture of the braking module.

BRIEF DESCRIPTION OF THE DRAWINGS

Preferred embodiments are explained in more detail below with reference to the drawings, in which.

DETAILED DESCRIPTION

In the following text, features that are similar or identical are denoted by the same reference signs.

Figure 1:
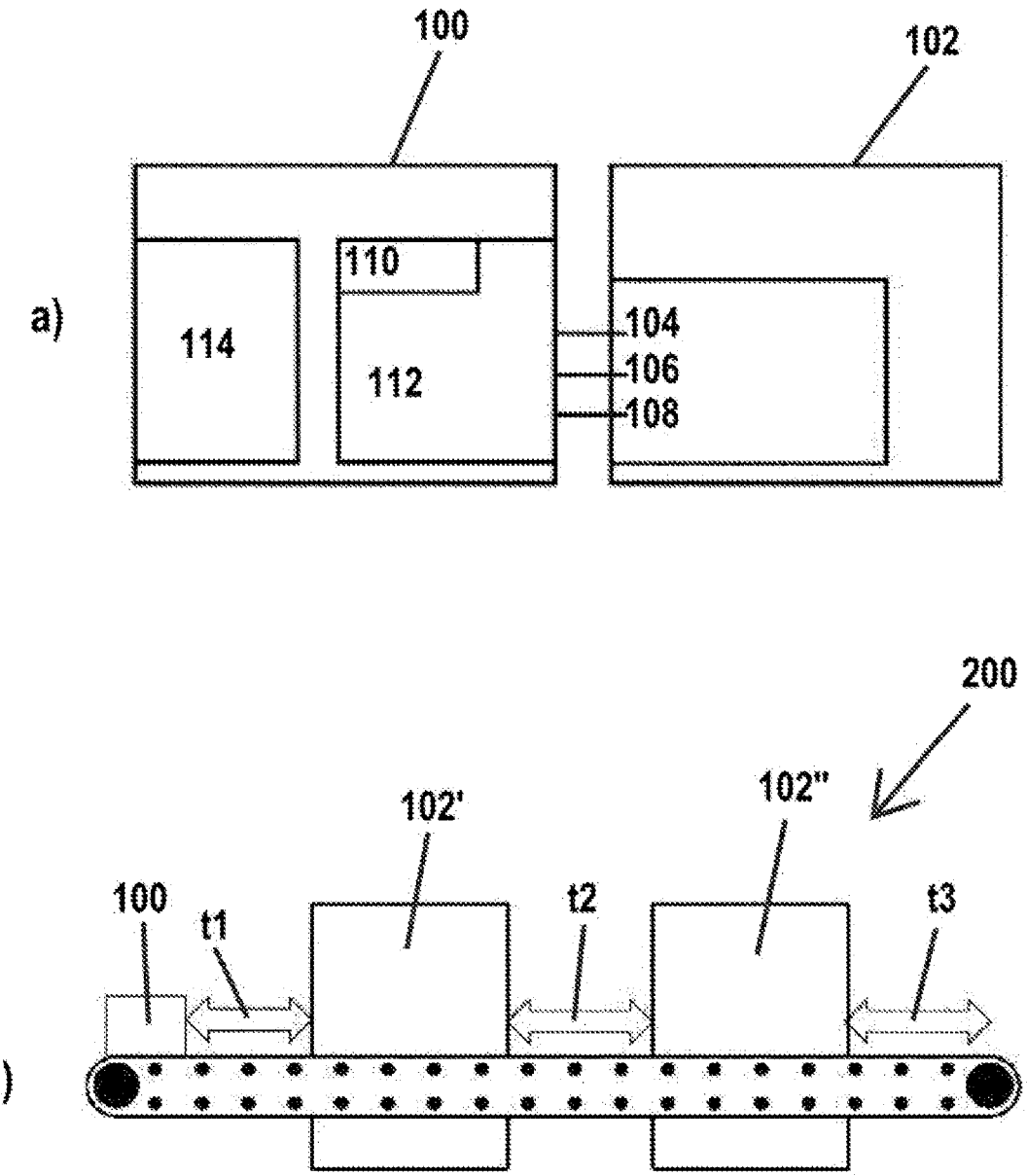
FIG. 1 shows a schematic illustration of the communication between the product and the manufacturing station and a corresponding manufacturing environment.

View a) in FIG. 1 schematically illustrates a product 100 that is connected to such an EOL station 102. For this purpose, the EOL station 102 has the following interfaces/connections to the product 100:
   communication interfaces 104 between the EOL station 102 and the product 100
   an energy supply 106
   a ground 108

Control commands are transmitted to the product software 110 by the electronic control unit 112 of the product via the communication interface 104 of the EOL station 102. The functions that are triggered by the software as a result may be either purely electronic functions (for example switching electronic components on and off) or mechanical (for example actuating actuators such as valves or the like) and are implemented by the corresponding mechanical control unit 114.

The product 100 in this case usually has to be conveyed in a manufacturing environment 200, as shown by way of example in view b) of FIG. 1, from one manufacturing station 102' to the next manufacturing station 102". During these transport times, no value is added to the product, meaning that the transport times remain unused for the manufacturing process itself. These transport times are indicated by way of example by $t_1$, $t_2$ and $t_3$ in view b) of FIG. 1. Furthermore, as soon as the product 100 arrives at an EOL station 102, further steps have to be performed before the process step envisioned at the EOL station 102 in the manufacturing process of the product 100 is able to be performed. The product 100 thus has to be connected to the corresponding interfaces of the EOL station 102, for which purpose the product 102 has to be moved to the corresponding positions of the EOL station 102. Only then is the electronic control unit 112 of the product 100 activated by the electrical signal from the EOL station 102. The product 100, and in particular its software functions 110, then has to be initialized, for example by initializing corresponding software variables. Further internal calibrations and preparations furthermore have to be taken before the product 100 is actually able to be controlled.

Likewise, a series of steps usually have to be performed when the product 100 leaves a manufacturing station, or EOL station 102. By way of example, product data have to be verified (verification of error and calibration data), and the product 100 has to be safely shut down and mechanically decoupled from the EOL station 102 before it is able to leave the station 102.

All of these process steps require additional time that cannot be used for other manufacturing steps. The manufacturing process is therefore inefficient. The use, according to the invention, of a module 300, as will be described below, makes it possible, inter alia, to overcome the described disadvantage caused by times that are not used optimally.

Figure 2:
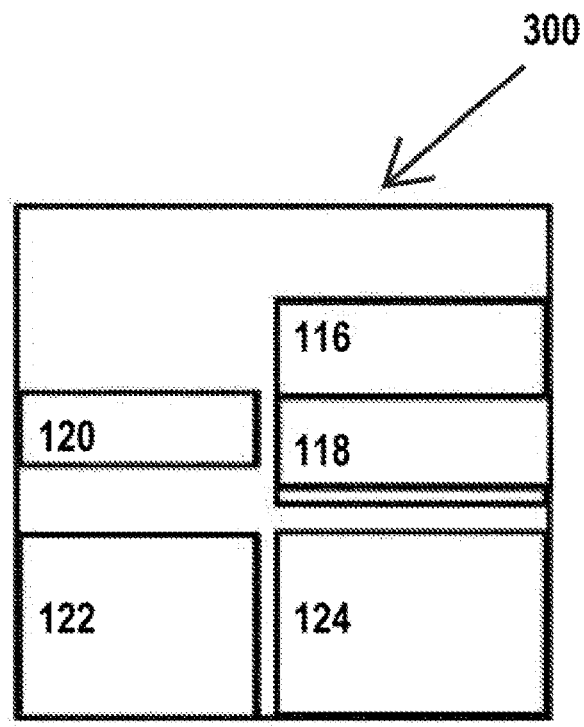
FIG. 2 shows a schematic illustration of a module.

FIG. 2 shows a schematic illustration of a module 300 in the form of a block diagram. The module 300 in this case first of all has a data processing unit 116, which has for example a motherboard with processor cores arranged on the motherboard, working memory, further storage media and a data bus. A WLAN module (Wi-Fi module) 118 is furthermore formed as a first interface, which enables communication between the module 300 and a manufacturing environment 200. Such a manufacturing environment 200 is explained in more detail below with reference to FIG. 3.

To operate the module 300 and to supply electrical energy to a product 100 connected to the module 300, the module 300 furthermore has an energy source 120 in the form of a battery. The battery may in this case in principle be any type of battery that has a voltage sufficient to operate the module 300 and to supply electrical energy to the product 100. In addition to a battery, however, any other type of electrical energy supply may in principle also be provided as energy source 120 in the module 300.

As already explained above, the module 300 is preferably designed firstly to communicate with a product 100 on which it is arranged and secondly to communicate with manufacturing stations (test stations) 102 within the manufacturing environment. For this purpose, the module 300 has a second interface 122 by way of which the module 300 is able to communicate with the product 100, preferably in a wired manner. The second interface 122 may in this case be embodied in the form of a (plug) connector customized to customer requirements. At the same time, the module 300 has a third interface 124 by way of which the module 300 is able to be connected to a manufacturing station (EOL station) 102 of the manufacturing environment 200, preferably in a wired manner. The third interface 124 may in this case use a connection standard that is predefined by the manufacturing environment 200. In this case, the module 300 effectively acts as an adapter between the product 100 and the manufacturing environment 200, such that the connection standards and connector types for the product 100 and the manufacturing environment 200 are able in principle to be selected independently of one another.

In the following text, a manufacturing environment 200 will now be described with reference to FIG. 3, in which manufacturing environment a product 100 with a module 300 arranged on the product 100 is manufactured or processed. For the sake of simplicity, the product 100 with the module 300 arranged on the product 100 is considered below to be a joint object.

Figure 3:
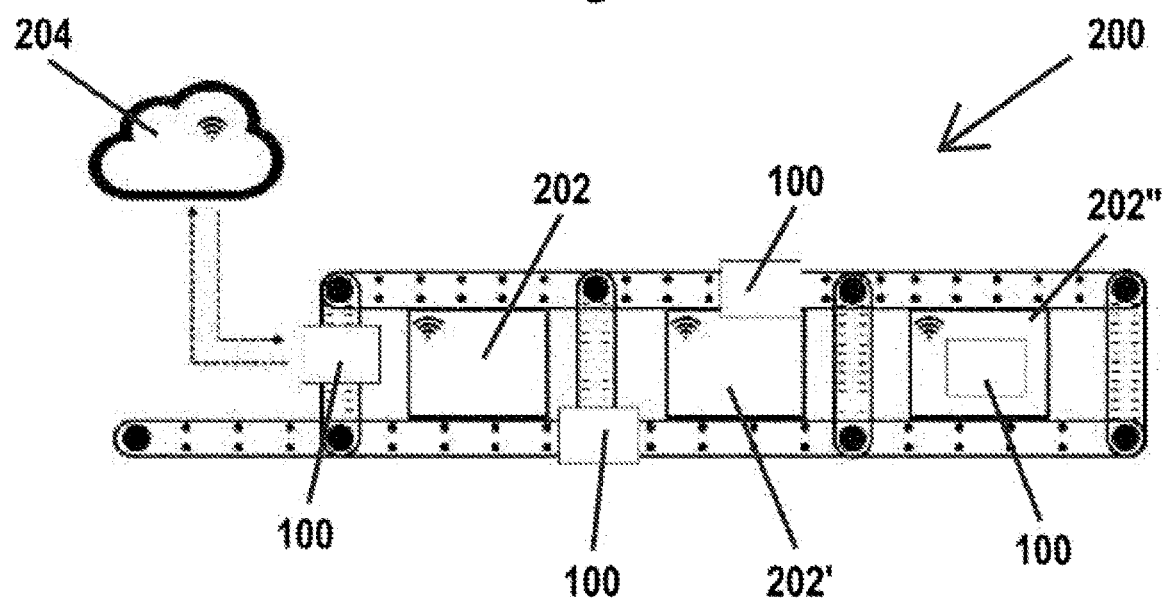
FIG. 3 shows a schematic illustration of a manufacturing environment.

The manufacturing environment 200 illustrated in FIG. 3 essentially has a conveyor line, for example a conveyor belt, which conveys the products 300 from one manufacturing station 202 to a next manufacturing station 202' during the manufacturing process. The illustration of FIG. 3 furthermore schematically indicates a cloud-based controller 204 of the manufacturing environment 200. The controller 204 is in this case designed to control the individual manufacturing stations 202 through the wireless transmission of appropriate control commands. Conversely, the manufacturing stations 202 are designed to transmit information, where necessary, for example from the performance of test routines on the product 100, to the controller 204, such that this information is able to be taken into account in the further control of the manufacturing process.

As indicated further schematically in FIG. 3, the products 100 are also able to communicate wirelessly directly with the manufacturing environment 200 or the controller 204 of the manufacturing environment 200 via the modules 300. Information about the current status of a product 100 or previously determined test and calibration data of the product 100 may in this case be transmitted to the controller 204. Conversely, information about a next manufacturing step, a method step to be performed or the like may likewise be transmitted wirelessly from the controller 204 to the product 100.

In addition to the wireless communication between the product 100 and the controller 204 of the manufacturing environment 200, provision is furthermore made for the products to be able to communicate directly with manufacturing stations 202 of the manufacturing environment 200 in a wired manner as soon as they have been transported to the manufacturing stations 202 and connected thereto. In this case, a power supply for the product 100 is ensured by the manufacturing station 202 itself, such that test and calibration routines that have an increased energy requirement are also able to be performed.

Each product 100 is in this case preferably able to be uniquely identified at any time by the manufacturing environment 200 or its controller 204 on the basis of an identifier (for example GUID) assigned to the connected module 300.

In the following text, with reference to FIG. 4, firstly the communication between the product 100 and the manufacturing environment 200 via the module 300 (view a) of FIG. 4 and secondly the communication between the product 100 and the manufacturing station 202 via the module 300 (view b of FIG. 4) are now described.

Figure 4:
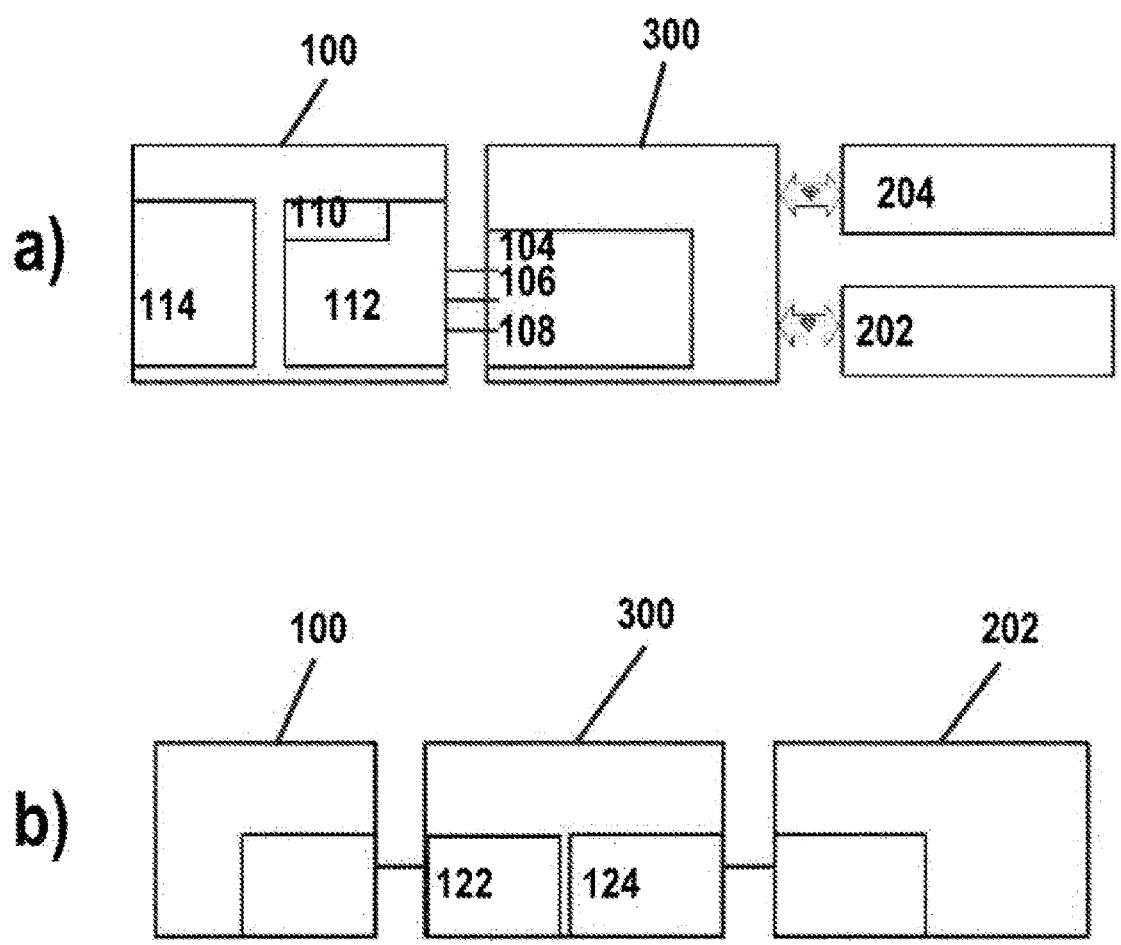
FIG. 4 shows schematic illustrations of the interaction between the product, the module and the manufacturing environment.

As illustrated in view a) of FIG. 4, the communication between the product 100 and the module 300 functions analogously to the communication, described at the outset with reference to view a) of FIG. 4, between a module and a manufacturing station 202. In this case too, the product 100 essentially has an electronic control unit 112 and a mechanical control unit 114, wherein the product software 110 is illustrated as part of the electronic control unit 112. In this case, the product 100 is designed, via the electronic control unit 112, to establish a connection to the module 300 instead of a connection to the manufacturing station 102. For this purpose, essentially communication interfaces 104 establish an energy supply 106 and a ground 108 between the product 100 and the module 300.

The actual communication of the product 100 itself with the manufacturing environment 200, or with the controller 204 of the manufacturing environment 200, then takes place indirectly via the module 300, which is designed for wireless communication with the manufacturing environment 200 and, where necessary, also for wireless communication with the manufacturing stations 202 of the manufacturing environment. Communication with the manufacturing stations 202 is in this case preferably necessary only if energy-intensive testing and calibration processes are to be performed on the product 100.

In this case, in addition to wireless communication between the module 300 and the manufacturing station 202, provision is furthermore made for a wired connection between the module 300 and the manufacturing station 202. By way of example, the energy required for performing processes may be provided by the manufacturing station 202 via this wired connection. Such a connection is described below with reference to view b) of FIG. 4.

View b) of FIG. 4 illustrates how a product 100 is connected to a manufacturing station 202 via the module 300. The connection between the product 100 and the module 300 is in this case made via the second interface 122 of the module 300. The interface (connector type) that is used may in this case be tailored to customer requirements for the product 100. It is therefore ideally possible, in the second interface 122, to use the same connector type that a customer envisions for contact-connecting the product 100 in subsequent use thereof. The connection between the module 300 and the manufacturing station 202 is made through the third interface 124 of the module 300, which is essentially independent of the second interface 122. In this case, it is therefore possible to use a connector type that is predefined by the manufacturing environment 200 or the manufacturing station 202. The module 300 accordingly functions as an adapter between the manufacturing environment 200 (manufacturing station 202) and the product 100, such that the connection type of the product 100 is able to be selected independently of the connection type of the manufacturing environment. A separate changeover between the connection types is no longer necessary.

The invention claimed is:

1. A module for initializing and calibrating a product during the manufacture of the product in a manufacturing environment, wherein the module is arranged on the product and wherein the module comprises:
   a first interface for wireless data transmission between the module and the manufacturing environment,
   a second interface for establishing a data connection between the module and the product,
   an electrical energy source,
   a data processing unit,
   wherein the module is configured to supply the product at least temporarily with energy by way of the energy source, configured to establish a data connection with the product via the second interface, and configured to perform test and/or calibration routines on the product via the second interface, wherein the data processing unit generates test and/or calibration data during the performance of the test and/or calibration routines, and configured to transmit the test and/or calibration data to the manufacturing environment via the first interface.

2. The module as claimed in claim 1, wherein the module is designed to configure a software function of the product after the data connection has been established.

3. The module as claimed in claim 2, wherein the product is supplied with energy by way of the second interface.

4. The module as claimed in claim 3, wherein the module has a holder, and
wherein the module is attached to the product by way of the holder.

5. The module as claimed in claim 4, wherein the holder is part of the second interface.

6. The module as claimed in claim 4, wherein the module has a third interface for establishing a wired connection between the module and the manufacturing environment, and
wherein the third interface is designed to transmit electrical energy between the manufacturing environment and the module.

7. A method for initializing a product during the manufacture of the product in a manufacturing environment by way of a module, the method comprising:
arranging the module on the product during manufacture thereof;
activating the module;
establishing a data connection between the module and the product;
performing test and/or calibration routines on the product, wherein the data processing unit generates test and/or calibration data during the performance of the test and/or calibration routines; and
transmitting the test and/or calibration data to the manufacturing environment.

8. The method as claimed in claim 7, wherein the manufacturing environment arranges the module on the product in the course of a manufacturing step of the product.

9. The method as claimed in claim 8, wherein the test and/or calibration routines to be performed are transmitted to the module by the manufacturing environment.

10. The method as claimed in claim 9, wherein the transmitted test and/or calibration routines depend on previously transmitted test and/or calibration data.

11. The method as claimed in claim 10, wherein the manufacturing environment has at least one test station, wherein the method furthermore comprises establishing a wired connection between the test station and the module, wherein the product is supplied with electrical energy by the test station after the wired connection has been established.

* * * * *